(12) United States Patent
Chen et al.

(10) Patent No.: US 6,261,978 B1
(45) Date of Patent: *Jul. 17, 2001

(54) PROCESS FOR FORMING SEMICONDUCTOR DEVICE WITH THICK AND THIN FILMS

(75) Inventors: Ping Chen, Round Rock; Navakanta Bhat, Austin; Paul G. Y. Tsui, Austin; Daniel T. K. Pham, Austin, all of TX (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,875

(22) Filed: Feb. 22, 1999

(51) Int. Cl.[7] ................................................ H01L 21/8234
(52) U.S. Cl. .......................... 438/981; 438/224; 438/228; 438/275
(58) Field of Search ..................................... 438/224, 228, 438/275, 981

(56) References Cited

U.S. PATENT DOCUMENTS

| | | | |
|---|---|---|---|
| 3,699,646 | 10/1972 | Vadasz | 29/571 |
| 3,878,549 | * 4/1975 | Yamazaki et al. | 257/325 |
| 4,808,555 | 2/1989 | Mauntel et al. | 437/191 |
| 5,316,965 | * 5/1994 | Philipossian et al. | 438/424 |
| 5,316,981 | * 5/1994 | Gardner et al. | 438/264 |
| 5,334,861 | 8/1994 | Pfiester et al. | 257/67 |
| 5,635,053 | * 6/1997 | Aoki et al. | 205/746 |
| 5,953,599 | * 9/1999 | El-Diwany | 438/199 |
| 5,960,289 | * 9/1999 | Tsui et al. | 438/275 |
| 5,970,345 | * 10/1999 | Hattangady et al. | 438/279 |
| 5,998,305 | * 12/1999 | Holmer et al. | 438/795 |
| 6,015,477 | * 1/2000 | Hoffman et al. | 203/13 |

OTHER PUBLICATIONS

CRC Handbook of Chemistry and Physics, David R. Lide, Ph.D., CRC Press, 1996, p. 12–52.*
Stanley Wolf PhD. and Richard N. Tauber Ph.D. in Silicon Processing for the VLSI Era, vol. 1: Process Technology, Lattice Press, 1986, p. 195.*
Akiya et al., "Thin Oxide Integrity Degradation Due to Diluted Hydrofluoric Acid Treatment," Extended Abstract, Electro Chemical Society vol. 94–2, Conference Proceedings, Abstract No. 476, LSI Laboratories NTT, pp. 752–753.

* cited by examiner

*Primary Examiner*—Charles Bowers
*Assistant Examiner*—William M. Brewster
(74) *Attorney, Agent, or Firm*—Kent J. Cooper; Robert A. Rodriguez

(57) ABSTRACT

A first dielectric layer (22) is formed over a semiconductor device substrate. A resist layer (32) is then patterned to expose portions of the first dielectric layer (22). Portions of the first dielectric layer (22) are removed to expose portions of the semiconductor device substrate (42). The resist layer (32) is then removed. The semiconductor device substrate is cleaned without using a fluorine-containing solution and a second dielectric layer (62) is formed overlying the semiconductor device substrate.

19 Claims, 4 Drawing Sheets

PROCESS FOR FORMING SEMICONDUCTOR DEVICE WITH THICK AND THIN FILMS

FIELD OF THE INVENTION

This invention relates in general to processes for forming semiconductor devices, and more particularly to processes for forming semiconductor devices including gate dielectric layers.

RELATED ART

Semiconductor devices having more than one gate dielectric thickness are becoming more common as transistors operating at different voltage potentials continue to be incorporated into integrated circuit designs. For example, separate transistors in a nonvolatile memory can operate at different voltage potentials to accommodate different power consumption and performance considerations.

The manufacture of devices having different gate dielectric thicknesses can be problematic. One conventional method for forming such devices includes forming a first gate dielectric layer, typically having a thickness greater than approximately 25 nanometers (nm), over the semiconductor device substrate. The first gate dielectric layer is patterned and etched to expose regions of the substrate where a second gate dielectric layer is subsequently formed. After removing the resist, prior to forming the second gate dielectric layer, a preclean sequence is performed. Conventional preclean sequences typically use hydrofluoric (HF) acid solutions, or other oxide etchants, to etch and remove upper portions of the first gate dielectric layer that can contain residual organic mobile ion contamination introduced by the resist layer. Following the preclean step, the second gate dielectric layer, with a thickness typically in a range of approximately 7–10 nm, is formed.

Problems associated with this preclean sequence are related to the uniformity of the etch that removes the uppermost portions of the first gate dielectric layer. For gate dielectric layers below 25 nm, the nonuniformity of the etch produces a varying thickness of gate dielectric layer that results in relatively wide distributions of device parameters, such as charge to breakdown, threshold voltage, and drive currents. In addition, the etch can form pinholes and roughen the surface of the first gate dielectric layer. Surface roughness and pinholes become increasingly detrimental to transistor operation as the gate dielectric layer becomes thinner.

Other methods for forming more than one thickness of gate dielectric layer address these issues. However, they are undesirable for one or more reasons. One such method implants and anneals nitrogen in areas where the thinner gate dielectric layer is to be formed. However, process control and scalability of this method is difficult because the oxidation rate varies significantly depending on the implant conditions. Another method uses a double gate integration process to first form the thinner gate dielectric layer and its electrode before forming the thicker gate dielectric layer. This process is more complex and costly because an additional masking operation is required. In a final method, a thin nitride layer is formed over the first gate dielectric layer to protect it during the HF preclean. However, because the thickness requirement of the nitride layer is only approximately 1–3 nm, conventional furnace nitride depositions cannot be used. The deposition, therefore, requires using lower throughput single wafer processes.

BRIEF DESCRIPTION OF THE FIGURES

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

In accordance with embodiments of the present invention, a first dielectric layer is formed over a semiconductor device substrate. A resist layer is patterned to expose portions of the first dielectric layer, and portions of the first dielectric layer are removed to expose portions of the semiconductor device substrate. The resist layer is removed, and the semiconductor device substrate is cleaned without using a fluorine-containing solution. A second dielectric layer is then formed overlying the semiconductor device substrate.

Figure 1:
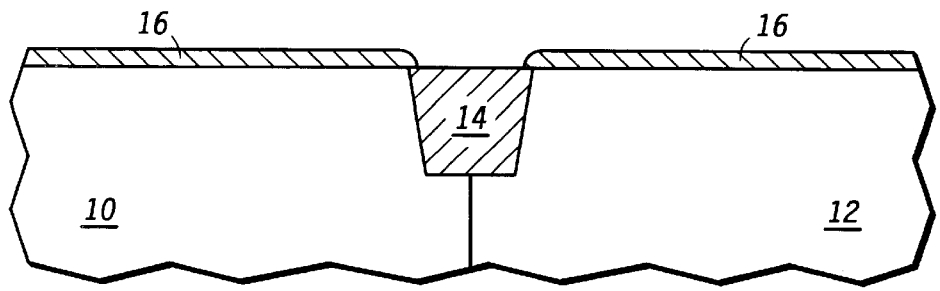
FIG. 1 includes an illustration of a cross-sectional view of a portion of a semiconductor substrate after forming well regions.

FIG. 1 includes an illustration of a cross-sectional view of a portion of semiconductor device substrate. As used in this specification, a semiconductor device substrate includes a monocrystalline semiconductor wafer, a semiconductor-on-insulator wafer, or any other substrate used in forming semiconductor devices. As illustrated in FIG. 1, a field isolation region 14 is formed within a portion of the semiconductor device substrate. Although illustrated in FIG. 1 as shallow trench isolation, other field isolation processes could be used. A sacrificial oxide layer 16, having a thickness in a range of approximately 5–30 nm, is formed over the semiconductor device substrate. The semiconductor device substrate is subsequently patterned and doped to define P-well region 10 and N-well region 12.

Figure 2:
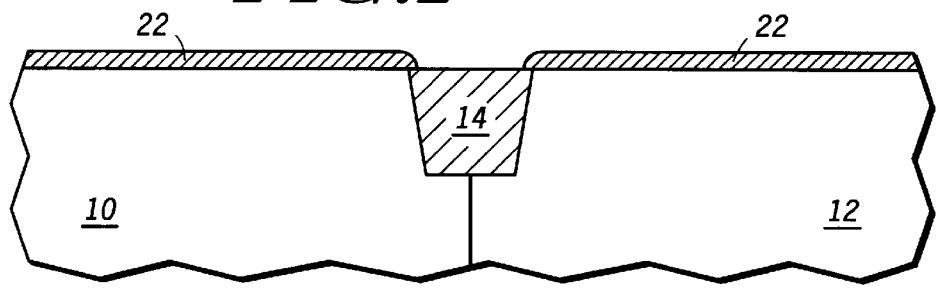
FIG. 2 includes an illustration of a cross-sectional view of the substrate of FIG. 1 after forming a first gate dielectric layer.
Figure 3:
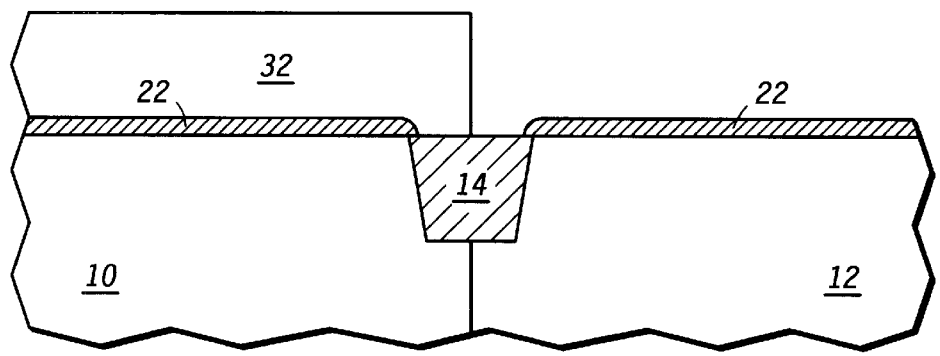
FIG. 3 includes an illustration of a cross-sectional view of the substrate of FIG. 2 after forming resist over the first gate dielectric layer.

The sacrificial oxide layer 16 is removed and a first gate dielectric layer 22 is formed over the P-well region 10 and N-well region 12, as shown in FIG. 2. The first gate dielectric layer 22 is typically formed using a thermal oxidation process. The thickness of first gate dielectric layer 22 is typically less than approximately 15 nm, and usually the thickness is less than 10 nm. In one specific embodiment, the first gate dielectric layer 22 has a thickness and a range of approximately 5 to 8 nm. Because the first gate dielectric layer 22 is exposed to subsequent chemical processes, the layer is formed such that it is relatively dense. In one specific example, the gate dielectric layer 22 is formed at a temperature in a range of approximately 800° C. to 1000° C. using an ambient including molecular oxygen and a chlorine-containing species, such as hydrochloric acid (HCl), trichloroethane ($C_2H_3Cl_3$), or the like, wherein the chlorine species makes up to approximately 10 percent volume percent of the ambient. The oxide is then annealed at a temperature in a range of approximately 800° C. to 1000° C. for up to approximately 30 minutes.

After forming the first gate dielectric layer 22, a resist layer 32 is patterned to expose portions of the first gate dielectric layer 22 that are subsequently removed. Typically, the remaining portions of the first gate dielectric layer are areas used to form transistors that operate at higher electrical potentials or have other unique characteristics requiring a thicker gate dielectric layer.

Figure 4:
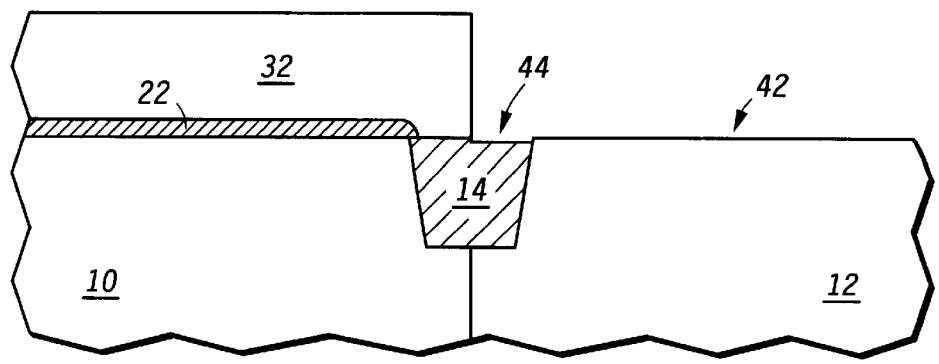
FIG. 4 includes an illustration of a cross-sectional view of the substrate of FIG. 3 after removing a portion of the first gate dielectric layer.
Figure 5:
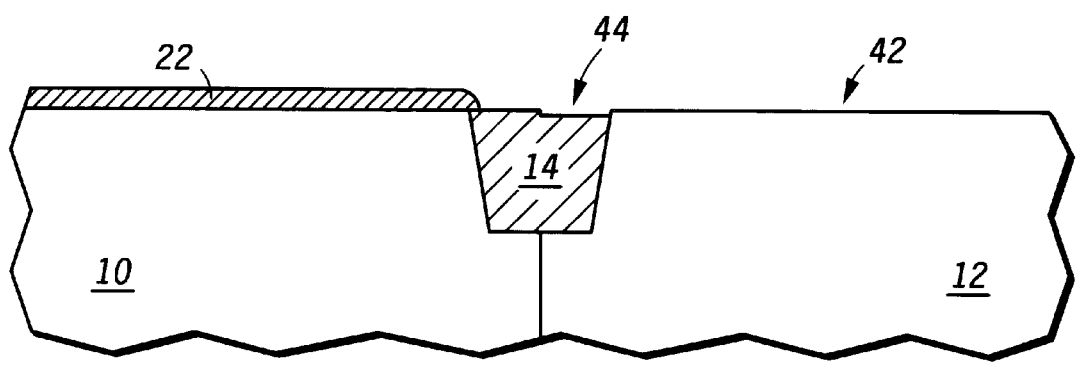
FIG. 5 includes an illustration of a cross-sectional view of the substrate of FIG. 4 during a second gate dielectric layer preclean sequence.

The exposed portion of the first gate dielectric layer 22, overlying N-well region 12, is removed to expose a surface 42 of the semiconductor device substrate, as shown in FIG. 4. Some amount of the field isolation region 14 is also removed during the process, as indicated by recessed portion 44. The removal is typically performed using a fluorine-containing solution, such as dilute hydrofluoric acid. The solution is applied in a spray acid tool (spray tool) to reduce the likelihood of resist erosion. Alternatively, the removal is performed in an emersion bath or using a plasma etch process. After the exposed portions of the first gate dielectric layer 22 have been removed, the resist layer 32 is removed, as shown in FIG. 5. Typically, the resist layer is removed using processes that do not significantly damage the first gate dielectric layer 22. For example, a downstream plasma asher, an organic solvent, or a sulfuric acid and hydrogen peroxide ($H_2SO_4$—$H_2O_2$) solution can be used to remove the resist layer 32.

A preclean of the semiconductor device substrate is then performed prior to forming a second gate dielectric layer. During the precleaning sequence, an $H_2SO_4$—$H_2O_2$ solution is initially used to remove residual organic contamination from exposed surfaces of the semiconductor device substrate. Unlike the prior art methods, no intentional oxide etching step is used during the precleaning sequence. In the prior art, an HF dip would ordinarily be performed to remove native oxide formed over the bare surface 42 and to etch the uppermost portions of the first gate dielectric layer 22 that can contain contamination introduced by the resist. The inventors have discovered that this oxide etching step is unnecessary and potentially causes gate oxide formation and reliability problems that will subsequently be addressed. Therefore, the first gate dielectric layer 22 is not exposed to fluorine-containing solutions or gases as part of the precleaning sequence.

The substrate is removed from the $H_2SO_4$—$H_2O_2$ solution, rinsed in deionized water ($H_2O$), and exposed to an ammonium hydroxide and hydrogen peroxide ($NH_4OH$—$H_2O_2$) solution. The substrate is then rinsed in deionized $H_2O$, exposed to a hydrochloric acid and hydrogen peroxide (HCl—$H_2O_2$) solution (to remove residual metallic contamination from the surface 42 of the substrate), and again rinsed in deionized $H_2O$.

Figure 6:
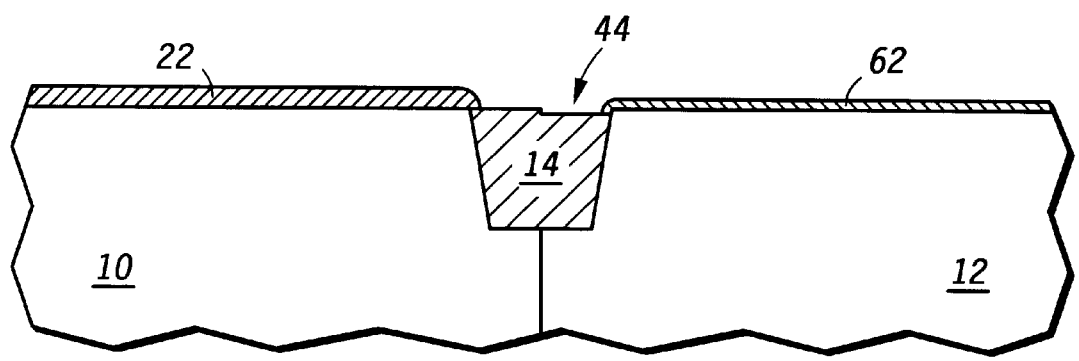
FIG. 6 includes an illustration of a cross-sectional view of the substrate of FIG. 5 after forming a second gate dielectric layer.

The substrate is then processed to form a second gate dielectric layer 62 that is thinner than the first gate dielectric layer 22, as shown in FIG. 6. Typically, the second gate dielectric layer 62 is formed using a thermal oxidation process, and its thickness is in a range of approximately 2 to 8 nm. During formation of the second dielectric layer 62, the thickness of the first dielectric layer 22 increases by an amount proportional to the final thickness of the second gate dielectric layer 62. The final thickness of the first dielectric layer 22 is typically in a range of approximately 7–10 nm.

Figure 7:
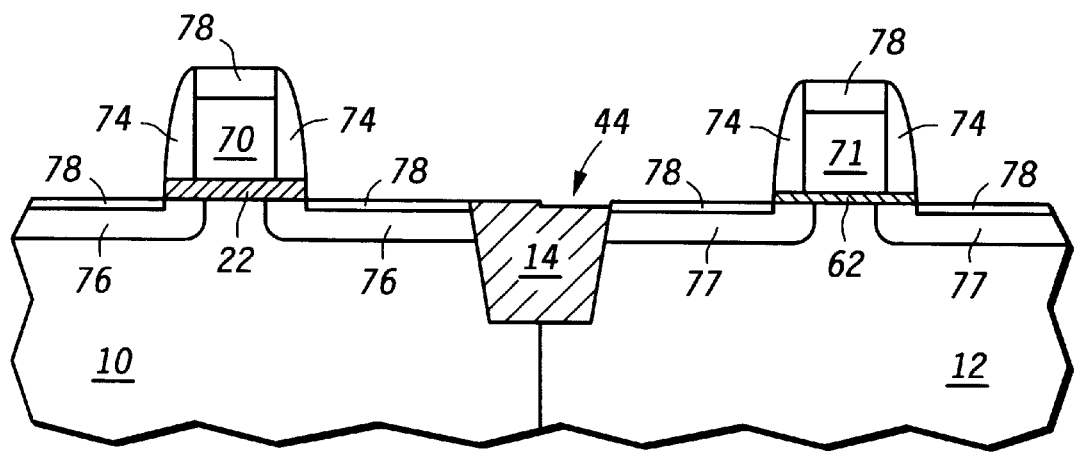
FIG. 7 includes an illustration of a cross-sectional view of the substrate of FIG. 6 after forming active components within portions of the substrate.

After forming the second gate dielectric layer 62, processing continues to form gate electrodes 70 and 71 and source/drain regions 76 and 77, as shown in FIG. 7. In one particular embodiment, a conductive material, such as polysilicon or silicon germanium, is formed over the first and second gate dielectric layers 22 and 62. The conductive material is patterned and etched to form gate electrodes 70 and 71. Spacers 74 are formed along the sidewalls of the gate electrodes 70 and 71. Appropriate masking layers and implants are used to dope the gates 70 and 71 and their respective source/drain regions 76 and 77. N-type dopants are used in P-well regions to form n-channel transistors, and p-type dopants are used in N-well regions to form n-channel transistors. FIG. 7 illustrates an example in which the p-channel transistor is formed using the thicker first gate dielectric layer 22 and the n-channel transistor is formed using the thinner second gate dielectric layer 62.

In one particular embodiment, silicide regions 78 are formed over exposed surfaces of the source/drain regions 76 and 77 and the gate electrodes 70 and 71 after forming doped source/drain regions 76 and 77 and doping the gate electrodes 70 and 71. The silicide material can include titanium cobalt, molybdenum, or the like. In this specific embodiment, the suicide is formed using a self aligned process.

Figure 8:
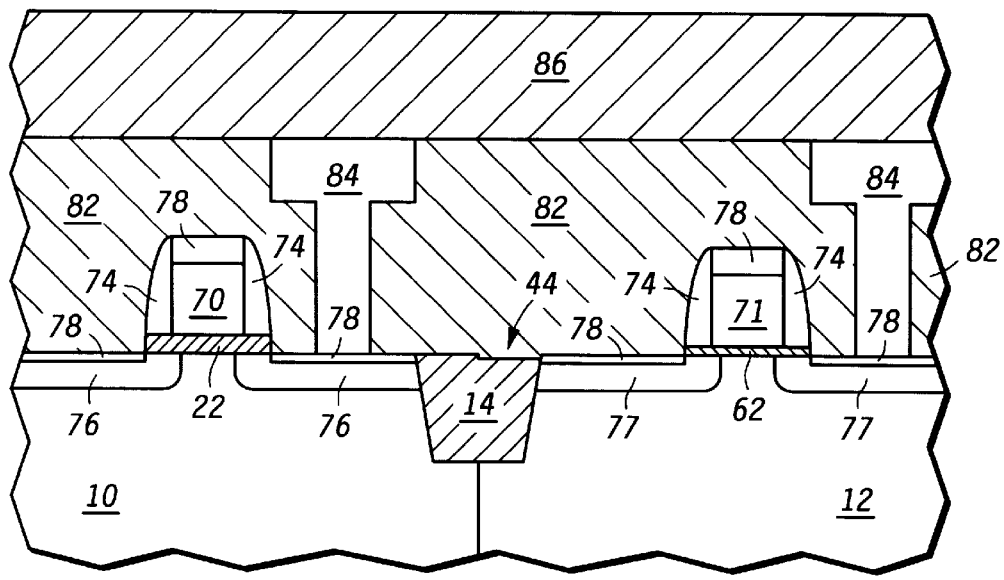
FIG. 8 includes an illustration of a cross-sectional view of the substrate of FIG. 7 after forming a substantially completed device.

Following the formation of the transistors, an interlevel dielectric (ILD) layer 82 and interconnects 84 are formed, as shown in FIG. 8. The ILD layer 82 typically includes one or more films that include an oxide, a nitride, a low dielectric constant (low-k) material, or the like. As used in the specification, low-k means that the dielectric constant of the film is lower than approximately 3.5. In some embodiments, the low-k dielectric layer can include organic materials. Additionally, hardmask and capping films can be used, as needed, to pattern and define openings for the interconnects 84.

The interconnects 84 include two portions. The via portions are relatively narrow and make contact to the silicide regions 78. The trench portions are wider and allow connections to be made between via portions. Therefore, the trenches primarily form horizontal connections within ILD layers, whereas the vias primarily form vertical connections between overlying conductive layers. The interconnects 84 can include conductive materials such as aluminum, copper, or the like. Dopants or alloying elements can be added to the interconnects to improve electromigration resistance or other electrical or reliability properties. Typically, adhesion/barrier films are formed within the interconnect opening before forming the conductive material within the interconnect opening.

Following the formation of the interconnects 84, a passivation layer 86 is formed over the semiconductor device. Although not shown, other electrical connections are made to other silicide regions 78 but are not illustrated in FIG. 8. Additionally other ILD layers and interconnect levels can be formed as needed to form a substantially completed device.

Many alternative embodiments of the present invention are possible. For example, the first or second gate dielectric layers 22 or 62 can be formed by methods other than thermal oxidation, such as chemical vapor deposition, physical vapor deposition, or combinations thereof. Additionally, if the gate dielectric layers 22 or 62 are formed using combinations of the foregoing methods, annealing steps can be performed after forming a first portion of the dielectric layer and prior to forming a second portion of the dielectric layer. The gate dielectric layers 22 and 62 can also include high-k materials. As used in the specification, high-k indicates that the dielectric constant of the material is greater than approximately 4.2. For example, the first or second gate dielectric layer 22 or 62 can include silicon nitride, silicon oxynitride, tantalum pentoxide, barium strontium titanate, lead zirconate titanate, and the like. Alternatively, the first or second gate dielectric layer can be nitrided or otherwise include nitrogen within the dielectric film. Although the embodiments show N+ and P+ gate electrodes, the gate electrodes could be all N+ or P+ depending on the desired electrical characteristics of the device. The gate electrodes can also alternatively be formed using metals or metal-containing materials, such as titanium, titanium nitride, tantalum, tantalum nitride, tungsten, tungsten nitride, or the like. Further, the transistors could all be formed within a P-type substrate, an N-type substrate, or include only N-channel or P-channel transistors.

A self-aligned silicide process was used in this embodiment. Alternatively, a non-self-aligned silicide process could be used. For example, after depositing the silicon gate electrode layer, a doping step could be performed to dope the gate electrode layer followed by a tungsten deposition and an anneal to form a tungsten silicide. After forming the tungsten silicide, the combination of the doped silicon and tungsten silicide can be patterned and etched to form the gate electrodes. Further, the gate electrode stack could include a silicon nitride layer or silicon-rich layer to be used as an insulator for making self-aligned contacts or as an anti-reflective layer.

Figure 9:
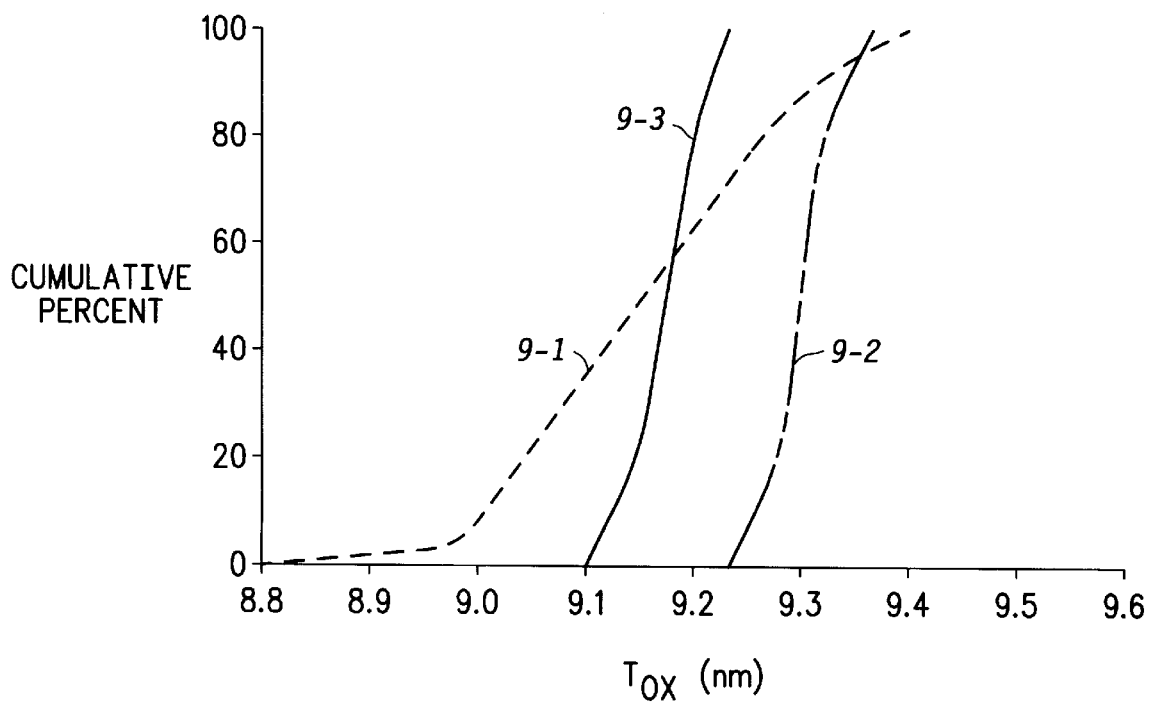
FIG. 9 includes an illustration comparing the thickness distribution of three different gate dielectric layers.
Figure 10:
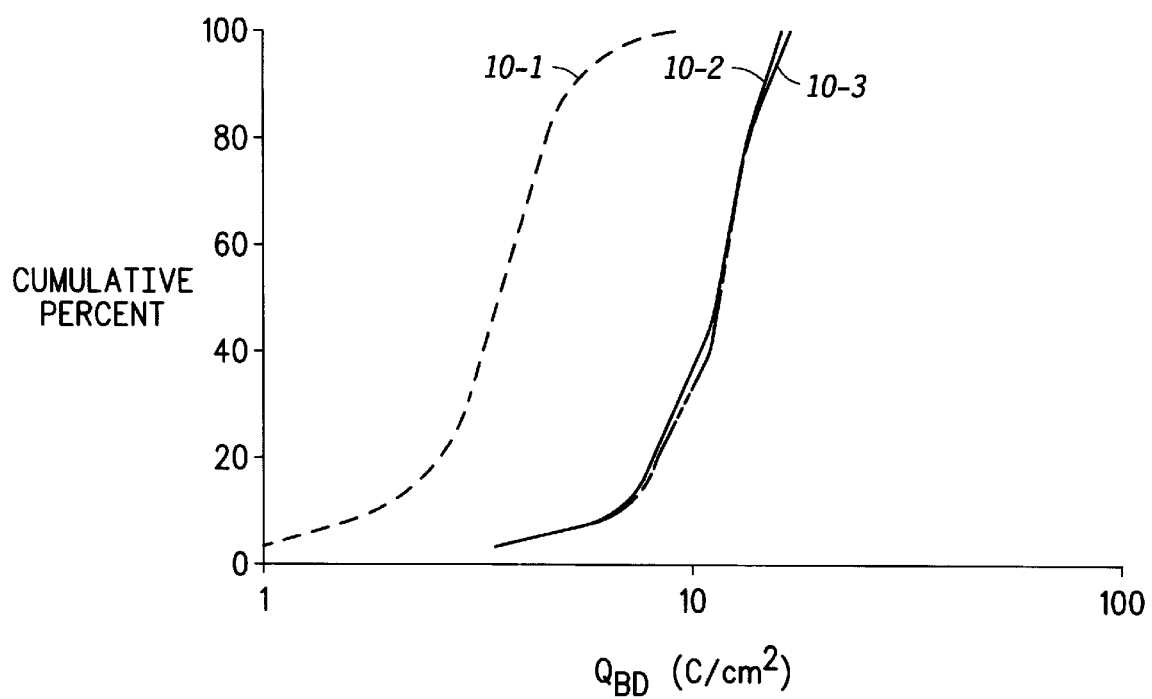
FIG. 10 includes an illustration comparing the charge to breakdown distribution of three different gate dielectric layers.

A number of benefits over the prior art are observed with embodiments of the present invention. Because the upper portions of the first gate dielectric layer are relatively unetched during the preclean process, the first gate dielectric layer retains its "as formed" properties. It is not prone to the thickness variations or the pinhole and surface roughness damage encountered in the prior art. Therefore, the overall dielectric film quality is improved. FIGS. 9 and 10 show examples demonstrating such improvements.

FIG. 9 is a plot illustrating the cumulative percent thickness distributions for three different oxide films used as the gate dielectric layer 22, as shown in FIG. 8. Line 9-1 illustrates the thickness distribution of gate dielectric layer processed using the conventional method described previously. Line 9-2 illustrates the thickness distribution of a gate dielectric layer processed in accordance with an embodiment of the present invention, and line 9-3 illustrates the thickness distribution of a control sample, which is a single gate dielectric layer that is not exposed to HF after its formation. The plot illustrates that the thickness distribution standard deviation for both the control and the disclosed process are both approximately 0.03 nm. This is contrast to the conventional method which has a standard deviation of approximately 0.12 nm.

Therefore, the conventional method results in a gate dielectric layer that has a thickness standard deviation that is approximately 3 to 4 times higher than that of either the control or the disclosed process.

FIG. 10 is a plot illustrating the cumulative percent charge to breakdown (QBD) distributions of three similar dielectric films. QBD is a measurement of gate dielectric integrity. Line 10-1 illustrates the QBD distribution of a gate dielectric layer processed using the conventional method, line 10-2 illustrates the QBD distribution of a gate dielectric layer processed using one of the disclosed methods, and the line 10-3 illustrates the QBD distribution of the control sample. Line 10-2 indicates that the mean QBD for that disclosed process averages approximately 11 coulombs per square centimeter. This is in contrast to the conventional process which has a mean QBD of approximately 3.5 coulombs per square centimeter. This plot indicates that eliminating HF in the preclean increases the mean QBD by a factor of approximately 3–4 over the conventional method.

In addition, omitting the HF solution during the second gate dielectric layer preclean reduces the amount of field isolation erosion that would otherwise occur with conventional HF precleaning processes. Because less field isolation is eroded away during the precleaning process, the surface profile of the field isolation region 14 after the preclean, shown in FIG. 5, is closer to that of the surface profile of the field isolation region 14 before the preclean, shown in FIG. 4. Reliability may be improved because increased field isolation erosion generally results in an undesirable thinning of gate dielectric layers formed in areas adjacent to the edges of the field isolation regions.

Integration of embodiments of the present invention is relatively easy. It does not require additional masking operations as compared to conventional dual gate dielectric layer processes. Additionally, it does not require the use of marginal processes or unusual materials. Although there is no known limitation in the queue time between the preclean and the formation of the second gate dielectric layer 62, approximately 50 hours can pass between the time of the preclean and the formation of the second gate dielectric layer without experiencing significant adverse effects.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A process for forming a semiconductor device comprising the steps of:
    forming a first gate dielectric layer over a semiconductor device substrate;
    patterning a resist layer to expose a portion of the first gate dielectric layer;
    removing the exposed portion of the first gate dielectric layer to expose a surface portion of the semiconductor device substrate and to form a remaining portion of the first gate dielectric layer;
    forming a native oxide layer over the exposed surface portion of the semiconductor device substrate;
    removing the resist layer;
    performing a pre-gate clean on the semiconductor device substrate without using fluorine-containing solutions such that the remaining portion of the first gate dielectric layer and the native oxide layer are not etched by the pre-gate clean, wherein the pre-gate clean comprises at least one cleaning solution comprising hydrogen peroxide; and forming a second gate dielectric layer overlying the exposed surface portion of the semiconductor device substrate, wherein the native oxide layer and the remaining portion of the first gate dielectric layer are not etched prior to forming the second gate dielectric lay.

2. The process of claim 1, wherein a thickness of the first gate dielectric layer is less than approximately 15 nanometers.

3. The process of claim 1, wherein the first gate dielectric layer is formed using a thermal oxidation process.

4. The process of claim 1, wherein the first gate dielectric layer includes nitrogen.

5. The process of claim 1, wherein the step of removing the exposed portion of the first gate dielectric layer is performed using a process selected from a group consisting of a spray tool, submersion and plasma etch.

6. The process of claim 1, wherein the step of removing the exposed portion of the first gate dielectric layer includes using a fluorine-containing solution.

7. The process of claim 1, wherein the step of performing the pre-gate clean comprises the steps of:
   exposing the semiconductor device substrate to a solution of sulfuric acid and hydrogen peroxide;
   exposing the semiconductor device substrate to a solution of ammonium hydroxide and hydrogen peroxide; and
   exposing the semiconductor device substrate to a solution of hydrochloric acid and hydrogen peroxide.

8. The process of claim 1, wherein a thickness of the second gate dielectric layer is less than approximately 8.0 nanometers.

9. The process of claim 1, wherein the second gate dielectric layer is formed using a thermal oxidation process.

10. The process of claim 1, wherein the second gate dielectric layer includes nitrogen.

11. The process of claim 1, wherein the second gate dielectric layer has a second thickness and the first gate dielectric layer has a first thickness and the first thickness is greater than the second thickness.

12. The process of claim 1, wherein the step of forming the first gate dielectric layer comprises the steps of:
   forming a first portion of the first gate dielectric layer;
   annealing the first portion; and
   forming a second portion of the first gate dielectric layer.

13. A process for forming a semiconductor device comprising the steps of:
   forming a first gate dielectric layer over a semiconductor device substrate;
   patting a resist layer to expose a portion of the first gate dielectric layer;
   removing a portion of the first dielectric layer to expose a surface portion of the semiconductor device substrate and to form a remaining portion of the first gate dielectric layer;
   forming an oxide layer over the exposed surface portion of the semiconductor device substrate;
   removing the resist layer;
   performing a pre-gate clean on the semiconductor device substrate without using a fluorine-containing solution after removing the resist layer and prior to forming a second gate dielectric layer such that the remaining portion of the first gate dielectric and the oxide layer are not etched by the pre-gate clean, wherein the pre-gate clean comprises at least on cleaning solution comprising hydrogen peroxide; and
   forming the second gate dielectric layer overlying the exposed surface portion of the semiconductor device substrate, wherein the remaining portion of the first gate dielectric layer and the oxide layer are not etched prior to forming the second gate dielectric layer.

14. The process of claim 13, wherein the step of performing the pre-gate clean comprises the steps of:
   exposing the semiconductor device substrate to a solution of sulfuric acid and hydrogen peroxide;
   exposing the semiconductor device substrate to a solution of ammonium hydroxide and hydrogen peroxide; and
   exposing the semiconductor device substrate to a solution of hydrochloric acid and hydrogen peroxide.

15. The process of claim 13, wherein a thickness of the first gate dielectric layer is less than approximately 15 nanometers.

16. The process of claim 13, wherein a thickness of the second gate dielectric layer is less than approximately 8.0 nanometers.

17. The process of claim 13, wherein the second gate dielectric layer has a second thickness and the first gate dielectric layer has a first thickness, wherein the first thickness is greater than the second thickness.

18. The process of claim 13, wherein the first and second gate dielectric layers are formed using a thermal oxidation process.

19. A process for forming a semiconductor device comprising:
   forming a first gate dielectric layer over a semiconductor device substrate;
   patterning a resist layer to expose a portion of the first gate dielectric layer;
   removing the exposed portion of the first gate dielectric layer to expose a surface portion of the semiconductor device substrate and to form a remaining portion of the first gate dielectric layer;
   forming a native oxide layer over the exposed surface portion of the semiconductor device substrate,
   removing the resist layer;
   performing a pre-gate clean on the semiconductor device substrate after removing the resist layer and prior to forming a second gate dielectric layer, wherein solutions used to perform the the pre-gate clean are devoid of fluorine-containing solutions and the the pre-gate clean sequentially includes:
      exposing the semiconductor device substrate to a solution of sulfuric acid and hydrogen peroxide;
      exposing the semiconductor device substrate to a solution of ammonium hydroxide and hydrogen peroxide;
      exposing the semiconductor device substrate to a solution of hydrochloric acid and hydrogen peroxide, so that the remaining portion of the first gate dielectric layer and the native oxide layer are not etched by the pre-gate clean; and
   forming the second gate dielectric layer overlying the exposed surface portion of the semiconductor device substrate, wherein the native oxide layer and the portion of the first gate dielectric layer are not etched prior to forming the second gate dielectric layer and a thickness of the first gate dielectric layer and a thickness of the second gate dielectric layer are different.

\* \* \* \* \*

UNITED STATES PATENT AND TRADEMARK OFFICE
CERTIFICATE OF CORRECTION

PATENT NO.     : 6,261,978 B1
DATED          : July 17, 2001
INVENTOR(S)    : Ping Chen et al.

It is certified that error appears in the above-identified patent and that said Letters Patent is hereby corrected as shown below:

Column 7,
Line 11, after "lay", add -- ing --

Column 8,
Line 3, after "on", add -- e --
Line 61, after "and the", insert -- remaining --

Signed and Sealed this

Sixteenth Day of July, 2002

*Attest:*

*Attesting Officer*

JAMES E. ROGAN
*Director of the United States Patent and Trademark Office*